(12) United States Patent
Muramatsu et al.

(10) Patent No.: US 6,954,111 B2
(45) Date of Patent: Oct. 11, 2005

(54) VOLTAGE CONTROLLED OSCILLATOR HAVING SWITCHES TO ADJUST EFFECTIVE INDUCTOR LENGTHS

(75) Inventors: Yoshinori Muramatsu, Kanagawa (JP); Fuyuki Okamoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/352,031

(22) Filed: Jan. 28, 2003

(65) Prior Publication Data

US 2003/0146799 A1 Aug. 7, 2003

(30) Foreign Application Priority Data

Feb. 1, 2002 (JP) ........................................ 2002-026079

(51) Int. Cl.[7] ................................................ H03B 5/00
(52) U.S. Cl. ........................... 331/117 FE; 331/117 R; 331/167; 331/177 V; 331/36 L
(58) Field of Search ...................... 331/117 FE, 117 R, 331/167, 177 V, 36 L, 36 C

(56) References Cited

U.S. PATENT DOCUMENTS

| | | | |
|---|---|---|---|
| 4,593,257 A | | 6/1986 | Wignot |
| 6,127,900 A | * | 10/2000 | Laub et al. ................. 331/179 |
| 6,188,295 B1 | | 2/2001 | Tsai |
| 6,194,976 B1 | * | 2/2001 | Cantey et al. ............... 331/167 |
| 6,198,359 B1 | | 3/2001 | Wichern |

FOREIGN PATENT DOCUMENTS

| | | |
|---|---|---|
| JP | 08-162331 A | 6/1996 |
| JP | 2000-059143 | 2/2000 |
| JP | 2001-111341 | 4/2001 |
| KR | 97018985 | 4/1997 |
| TW | 83786 | 12/1986 |
| TW | 429670 | 4/2001 |

* cited by examiner

*Primary Examiner*—Arnold Kinkead
(74) *Attorney, Agent, or Firm*—Foley & Lardner LLP

(57) ABSTRACT

At the same control voltage Vtune, the oscillation frequency with only switches SW3 and SW4 being closed is higher than that with only switches SW1 and SW2 being closed. Accordingly, even when the oscillation frequency is lower than designed with only the switches SW1 and SW2 being closed and the capacitance of varactor diodes D1 and D2 cannot be controlled to provide the desired oscillation frequency, the desired oscillation frequency can be provided by closing only the switches SW3 and SW4 to control the capacitance of the varactor diodes D1 and D2. On the oscillation frequency, a coarse tuning can be performed by controlling the switches SW1 to SW4, while a fine tuning can be performed with the varactor diodes D1 and D2. Consequently, the range of the oscillation frequency is increased.

17 Claims, 10 Drawing Sheets

VOLTAGE CONTROLLED OSCILLATOR HAVING SWITCHES TO ADJUST EFFECTIVE INDUCTOR LENGTHS

BACKGROUND OF THE INVENTION

1. Field of the Invention

The present invention relates to voltage controlled oscillators suitable for use as a high-frequency signal oscillator and more particularly to an enhanced voltage controlled oscillator that has an increased variable range of oscillation frequency.

2. Description of the Related Art

Conventionally, a voltage controlled oscillator (VCO) has been available that is built in high-frequency semiconductor devices or the like. FIG. 1 is a circuit diagram showing a prior art voltage controlled oscillator.

In the prior art voltage controlled oscillator, an inductor L101 and an inductor L102 are each connected at one end thereof to a constant current power supply 101. The inductance of the inductor L101 is equal to that of the inductor L102. On the other hand, the inductor L101 is connected at the other end thereof with a varactor diode D101, the drain of a P-channel transistor Tr101, and the gate of a P-channel transistor Tr102, while the inductor L102 is connected at the other end thereof with a varactor diode D102, the drain of the P-channel transistor Tr102, and the gate of the P-channel transistor Tr101. An analog control voltage is applied to the varactor diodes D101 and D102, while a power supply voltage VDD is applied to the respective sources of the P-channel transistors Tr101 and Tr102.

In the prior art voltage controlled oscillator constructed as described above, it is possible to acquire an oscillation signal from the drains of the P-channel transistors Tr101 and Tr102. Assuming that the oscillation frequency of the oscillation signal is $\omega$, the sum of the inductance of the inductors L101 and L102 is L, and the total sum of the capacitance and parasitic capacitance of the varactor diodes D101 and D101 is C. Then, the oscillation frequency $\omega$ is given by Equation (1) as follows. That is, $$\omega = (LC)^{-1/2} \quad (1)$$

In general, the varactor diodes D101 and D101 each comprise a MOS transistor as a basic component, with the total capacitance derived from the sum of the capacitance of a gate oxide film and a depletion layer present in the substrate. Accordingly, varying the bias applied to the gate of the MOS transistor that constitutes the varactor diode will cause the depletion layer to vary in depth, thereby resulting in a change in the total capacitance. That is, varying the control voltage will cause a change in the total capacitance C, thereby enabling the oscillation frequency $\omega$ to vary.

However, the prior art voltage controlled oscillator as described above has a variable range of oscillation frequency of about +/−15% with respect to its average frequency. There is thus a problem that no tuning can be made beyond this range. Since the control voltage causes no change in the capacitance of the gate oxide film and the depletion layer undergoes only a limited variation in capacitance, this problem arises due to the varactor diode itself having a variable range of capacitance limited to some extent and the presence of parasitic capacitance being not varied by the control voltage. For high-speed operations of oscillators demanded in recent years, the inductors have been designed to have lower inductance in order to provide higher oscillation frequencies. This has led to a greater rate of change in inductance depending on the shape of the inductor as the inductance becomes lower. In other words, a slight difference between the shapes of the designed inductor and an actually fabricated one has a significant effect on the oscillation frequency. Under these circumstances, when the variable range of oscillation frequency is limited as narrow as mentioned above, a serious problem may not arise at oscillation frequencies with a relatively small difference between the shapes of the inductors but may occur to such an extent that the oscillation frequency cannot be provided as designed, making the oscillator unavailable for service. Accordingly, this leads to a significant decrease in fabrication yield of the oscillator.

Concerning the variable range of oscillation frequency, a circuit is disclosed in Japanese Patent Laid-Open Publication No. Hei 8-162331. In the circuit, an inductor is incorporated into a circuit device and then its inductance is made tunable by providing a looped wiring on the layer of a spiral wiring to coincide with the spiral wiring in a plan view, such that use is made of the mutual magnetic induction of the looped wiring to tune the inductance of the spiral wiring. However, since an electric current needs to be supplied all the time not only to the spiral wiring but also to the looped wiring, this circuit consumes a large current. Additionally, a parasitic capacitance is built in the looped wiring. Furthermore, the mutual magnetic induction does not provide a large variable range of inductance, thereby resulting in an insufficiently increased variable range of oscillation frequency.

SUMMARY OF THE INVENTION

It is therefore an object of the present invention to provide a voltage controlled oscillator that can provide an increased variable range of oscillation frequency.

A voltage controlled oscillator according to the present invention includes a pair of variable-capacitance capacitors having capacitance controlled by the same control voltage; a pair of inductors each connected to each of the pair of variable-capacitance capacitors; a constant current power supply for supplying an electric current to the pair of inductors; and switching device which switches between lengths of the pair of inductors through which the electric current flows.

In the present invention, switching by the switching device between the lengths of the inductors through which the electric current flows causes a variation in the inductance of the entire circuit. As shown in Equation (1), the variation in inductance results in a change in oscillation frequency. The present invention thus provides an increased variable range of oscillation frequency when compared with a prior art oscillator in which the oscillation frequency is tuned only with the capacitance of the variable-capacitance capacitor. Accordingly, even when the inductor is fabricated to be slightly different in shape from the designed one, tuning can be performed to provide the desired oscillation frequency.

The switching device may have a pair of switches each connected to one end portion of the inductor opposite to the other end portion to which each of the variable-capacitance capacitors is connected; and one pair of or a plurality of pairs of switches each connected to a position between both end portions of each of the inductors. In this case, the switch may include a transistor.

Furthermore, the voltage controlled oscillator may further include one pair of or a plurality of pairs of inductors connected to the pair of variable-capacitance capacitors, the inductors being supplied with an electric current by the constant current power supply, the electric current flowing therethrough being switched by the switching device.

Another voltage controlled oscillator according to the present invention includes a pair of variable-capacitance capacitors having capacitance controlled by the same control voltage; a pair of inductors each connected to each of the pair of variable-capacitance capacitors; a constant current power supply for supplying an electric current to the pair of inductors; and switching device which switches between positions on the pair of inductors at which the electric current is supplied thereto.

The switching device may have a pair of transistors each connected to one end portion of the inductor opposite to the other end portion to which each of the variable-capacitance capacitors is connected; and one pair of or a plurality of pairs of transistors each connected to a position between both end portions of each of the inductors.

Furthermore, the voltage controlled oscillator may further include a short circuit line for short-circuiting between the pair of inductors at positions thereof each closer to each of the variable-capacitance capacitors than the positions at which the pair or multiple pairs of transistors are connected to the pair of inductors. This makes it possible to provide an increased variable range of oscillation frequency while providing a stable amplitude to an oscillation signal.

Furthermore, the switching device may have a transistor connected to one end portion of the inductor opposite to the other end portion to which each of the variable-capacitance capacitors is connected; and one pair of or a plurality of pairs of transistors, provided at a position between both end portions of each of the inductors, for short-circuiting part of the inductors.

The inductors may be connected to the constant current power supply via the switching device, or preferably disposed symmetrically with respect to the switching device interposed therebetween.

DETAILED DESCRIPTION OF THE PREFERRED EMBODIMENT

Figure 1:
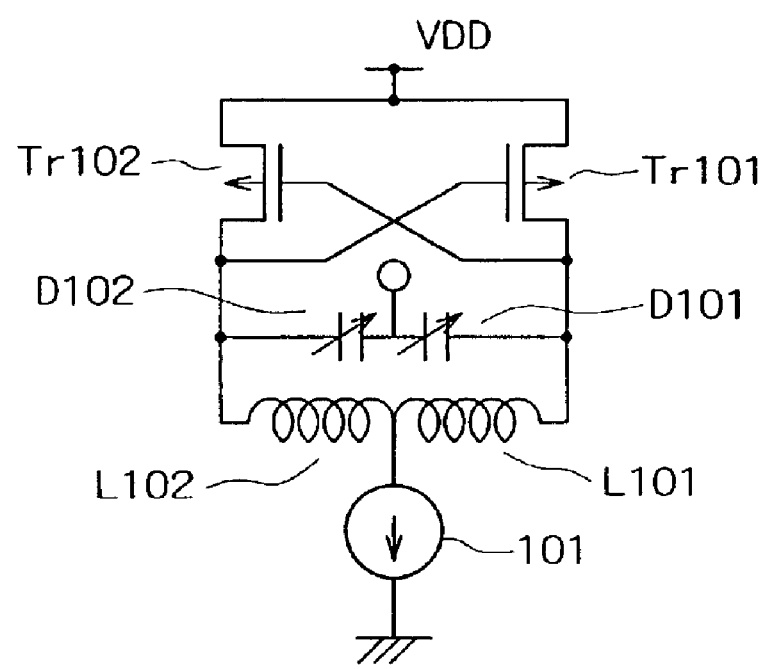
FIG. 1 is a circuit diagram showing a prior art voltage controlled oscillator.
Figure 2:
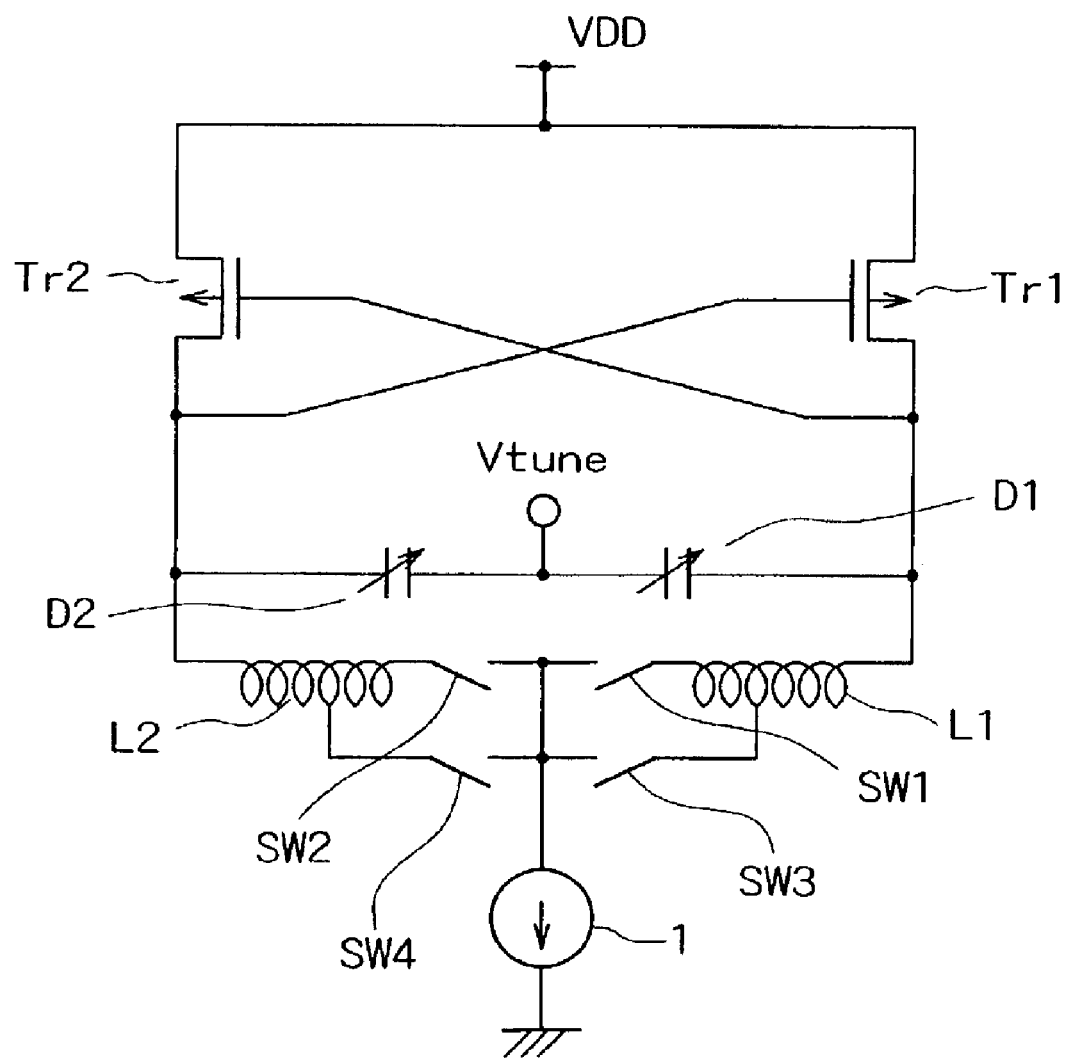
FIG. 2 is a circuit diagram showing a voltage controlled oscillator according to a first embodiment of the present invention.

Now, a voltage controlled oscillator (VCO) according to a first embodiment of the present invention will be explained below more specifically with reference to the accompanying drawings. FIG. 2 is a circuit diagram showing a voltage controlled oscillator according to the first embodiment of the present invention.

In this embodiment, there are provided four switches SW1 to SW4 connected each at one end thereof to a constant current power supply 1. The other ends of the switches SW1 and SW2 are connected to one ends of inductors L1 and L2, respectively. The inductors L1 and L2 are equal to each other in inductance. The other ends of the switches SW3 and SW4 are connected to the inductors L1 and L2 at their midpoint positions, respectively. The inductance of the inductor L1 between the switches SW1 and SW3 is equal to that of the inductor L2 between the switches SW2 and SW4.

The other end of the inductor L1 is connected with a varactor diode D1, the drain of a P-channel transistor Tr1, and the gate of a P-channel transistor Tr2, while the other end of the inductor L2 is connected with a varactor diode D2, the drain of the P-channel transistor Tr2, and the gate of the P-channel transistor Tr1. An analog control voltage Vtune is applied to the varactor diodes D1 and D2, and a power supply voltage VDD is supplied to the sources of the P-channel transistors Tr1 and Tr2.

Now, the operation of the voltage controlled oscillator according to this embodiment configured as described above is explained below.

Figure 3:
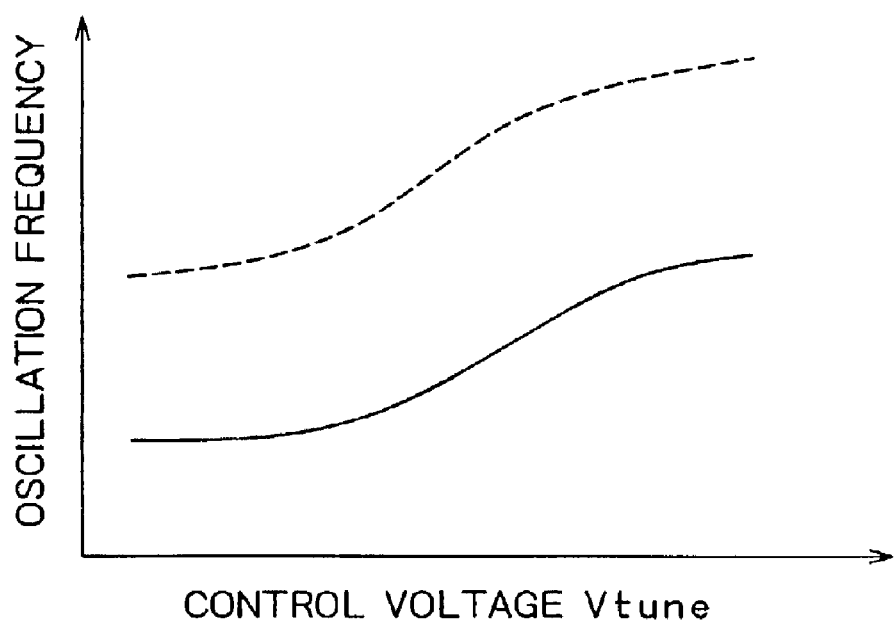
FIG. 3 is a graph showing the relationship between the control voltage Vtune and the oscillation frequency according to the first embodiment of the present invention.

FIG. 3 is a graph showing the relationship between the control voltage Vtune and the oscillation frequency according to the first embodiment of the present invention. The solid line of FIG. 3 shows the relationship with only the switches SW1 and SW2 being closed, while the broken line shows the relationship with only the switches SW3 and SW4 being closed.

In the voltage controlled oscillator configured as described above, it is possible to acquire an oscillation signal from the drains of the P-channel transistors Tr1 and Tr2. As shown in FIG. 3, the oscillation frequency of the oscillation signal varies in response to the control voltage Vtune. In other words, the oscillation frequency increases as the control voltage Vtune increases in both the cases where only the switches SW1 and SW2 are closed and only the switches SW3 and SW4 are closed. On the other hand, at the same control voltage Vtune, the oscillation frequency provided when only the switches SW3 and SW4 are closed is higher than that provided when only the switches SW1 and SW2 are closed. This is because an electric current flows only through part of the inductors L1 and L2 with only the switches SW3 and SW4 being closed, thereby reducing the inductance of the current path.

Suppose that the oscillation frequency is lower than designed with only the switches SW1 and SW2 being closed and the capacitance of the varactor diodes D1 and D2 cannot be controlled to provide the desired oscillation frequency. Even in this case, it is thus possible to provide the desired oscillation frequency by closing only the switches SW3 and SW4 to control the capacitance of the varactor diodes D1 and D2. That is, on the oscillation frequency, a coarse tuning can be performed by controlling the switches SW1 to SW4 and a fine tuning can be performed with the varactor diodes D1 and D2. Consequently, the range of the oscillation frequency is increased. For example, it is possible to increase the range of the oscillation frequency to about +/−30% with respect to a reference frequency.

In this embodiment, two pairs of switches are connected to the inductors L1 and L2. However, a larger number of switches can be employed for a coarse tuning in a greater number of steps, thereby further increasing the range of oscillation frequency.

Now, a structure will be explained below which implements the aforementioned embodiment.

Figure 4:
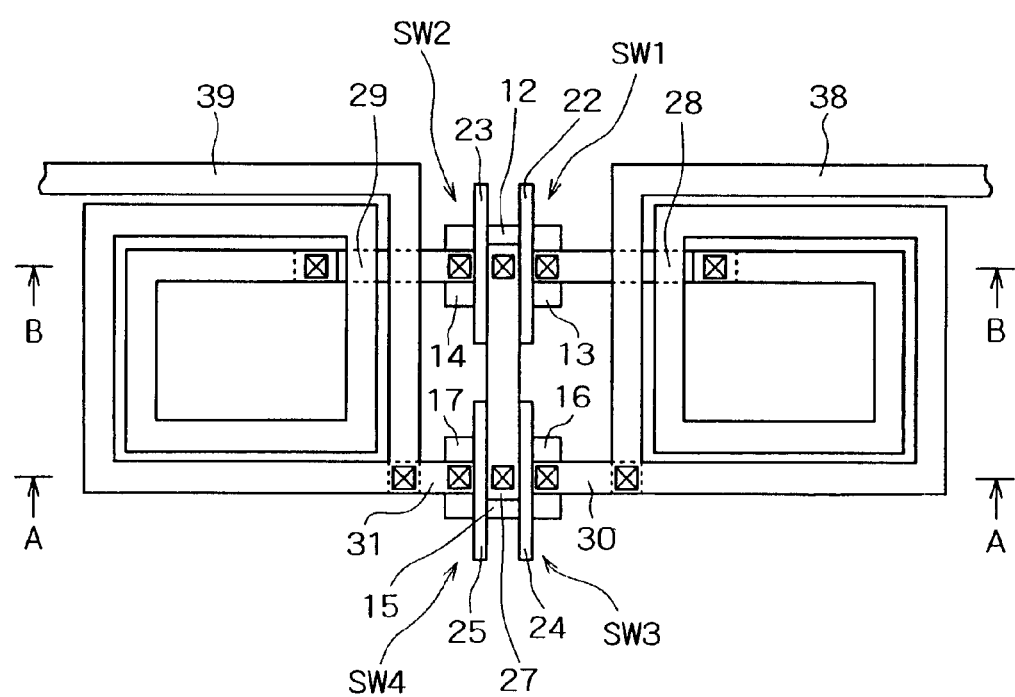
FIG. 4 is a layout of a voltage controlled oscillator according to the first embodiment of the present invention.
Figure 5:
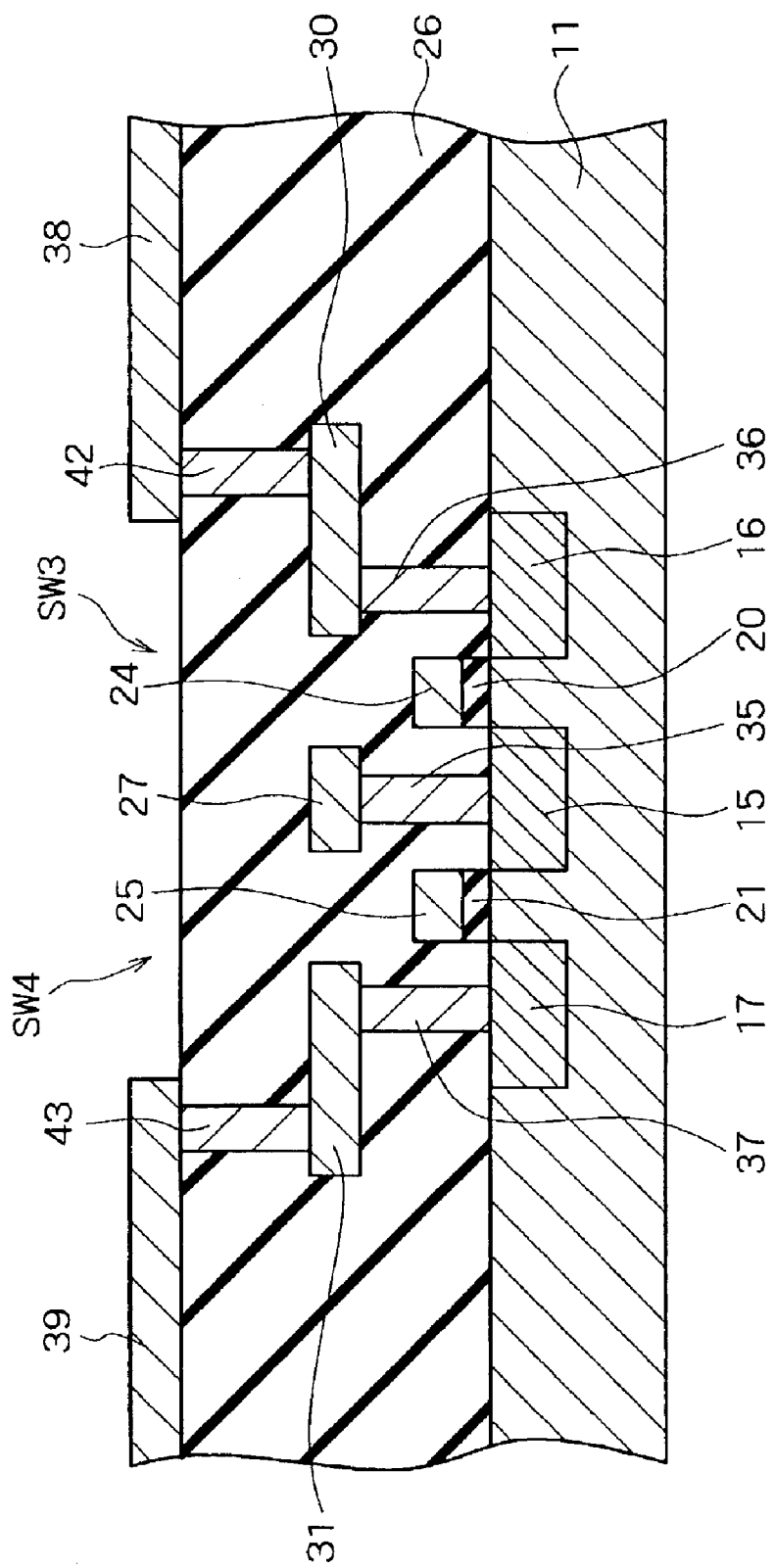
FIG. 5 is a cross-sectional view taken along the line A—A of FIG. 4.
Figure 6:
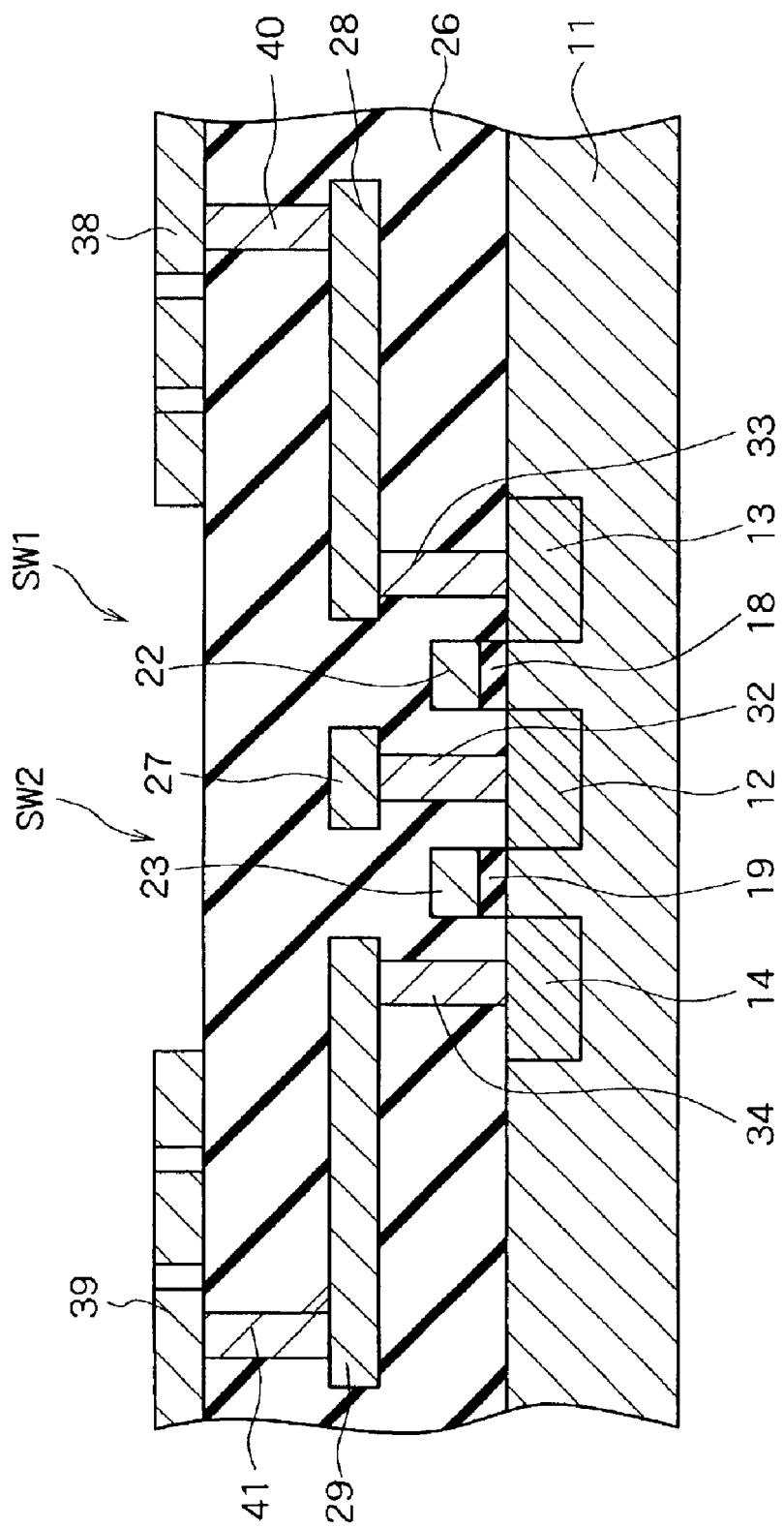
FIG. 6 is a cross-sectional view taken along the line B—B of FIG. 4.

FIG. 4 is a layout of the voltage controlled oscillator according to the first embodiment of the present invention. FIG. 5 is a cross-sectional view taken along the line A—A of FIG. 4, and FIG. 6 is a cross-sectional view taken along the line B—B of FIG. 4.

Formed on a surface of a semiconductor substrate 11 are a diffusion layer 12 shared by the switches SW1 and SW2, a diffusion layer 13 for the switch SW1, a diffusion layer 14 for the switch SW2, a diffusion layer 15 shared by the switches SW3 and SW4, a diffusion layer 16 for the switch SW3, and a diffusion layer 17 for the switch SW4. The diffusion layer 12 is located between the diffusion layer 13 and the diffusion layer 14, while the diffusion layer 15 is located between the diffusion layer 16 and the diffusion layer 17. A gate insulating film 18 for the switch SW1 is formed between the diffusion layers 12 and 13 on the semiconductor substrate 11, while a gate insulating film 19 for the switch SW2 is formed between the diffusion layers 12 and 14 on the semiconductor substrate 11. A gate insulating film 20 for the switch SW3 is formed between the diffusion layers 15 and 16 on the semiconductor substrate 11, while a gate insulating film 21 for the switch SW4 is formed between the diffusion layers 15 and 17 on the semiconductor substrate 11. There are formed gate electrodes 22 to 25 on the gate insulating films 18 to 21, respectively.

There is also an interlayer insulating film 26 formed on the entire surface. Embedded in the interlayer insulating film 26 are electrically conducting layers 27 to 31. Additionally, formed in the interlayer insulating film 26 are a contact 32 for connecting between the conducting layer 27 and the diffusion layer 12, a contact 33 for connecting between the conducting layer 28 and the diffusion layer 13, a contact 34 for connecting between the conducting layer 29 and the diffusion layer 14, a contact 35 for connecting between the conducting layer 27 and the diffusion layer 15, a contact 36 for connecting between the conducting layer 30 and the diffusion layer 16, and a contact 37 for connecting between the conducting layer 31 and the diffusion layer 17. On the interlayer insulating film 26, also formed are electrically conducting spiral layers 38 and 39 as the inductors L1 and L2, respectively. The conducting layers 38 and 39 are shaped so as to be symmetric in a plan view with respect to the conducting layer 27. Formed also in the interlayer insulating film 26 are a contact 40 for connecting between the conducting layer 28 and an inner end portion of the conducting layer 38, a contact 41 for connecting between the conducting layer 29 and an inner end portion of the conducting layer 39, a contact 42 for connecting between the conducting layer 30 and part of the conducting layer 38, and a contact 43 for connecting between the conducting layer 31 and part of the conducting layer 39. The contacts 42 and 43 are also located so as to be symmetric in a plan view with respect to the conducting layer 27.

The conducting layer 27 is supplied with an electric current by the constant current power supply 1, and a varactor diode or the like is connected to respective outer end portions of the conducting layers 38 and 39.

In the structure as described above, the MOS transistor having the gate electrode 22 acts as the switch SW1, the MOS transistor having the gate electrode 23 acts as the switch SW2, the MOS transistor having the gate electrode 24 acts as the switch SW3, and the MOS transistor having the gate electrode 25 acts as the switch SW4. Accordingly, the electric potential of the gate electrodes 22 and 23 and that of the gate electrodes 24 and 25 can be controlled mutually exclusively, thereby allowing either only the switches SW1 and SW2 to be closed or only the switches SW3 and SW4 to be closed. Providing control to the switches in this manner makes it possible to obtain a large oscillation frequency range as described above.

The switches SW1 to SW4 are typically set once after having been fabricated and fixed thereafter so as to obtain the desired oscillation frequency by tuning only the control voltage Vtune, but may also be changed according to the application.

In the aforementioned embodiment, multiple pairs of switches are connected to a pair of inductors to thereby provide a larger oscillation frequency range. However, it is also possible to provide an increased oscillation frequency range by providing multiple pairs of inductors and selecting one or multiple pairs of inductors therefrom.

Figure 7:
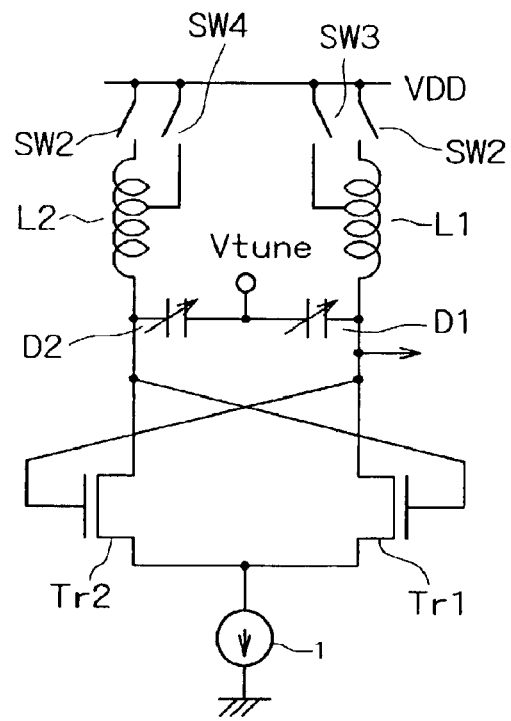
FIG. 7 is a circuit diagram showing a voltage controlled oscillator according to another embodiment of the present invention.

As an alternative embodiment of the present invention, the transistors Tr1 and Tr2 may also be connected between the constant current power supply 1 and the inductors L1, L2, respectively, as shown in FIG. 7.

Figure 8:
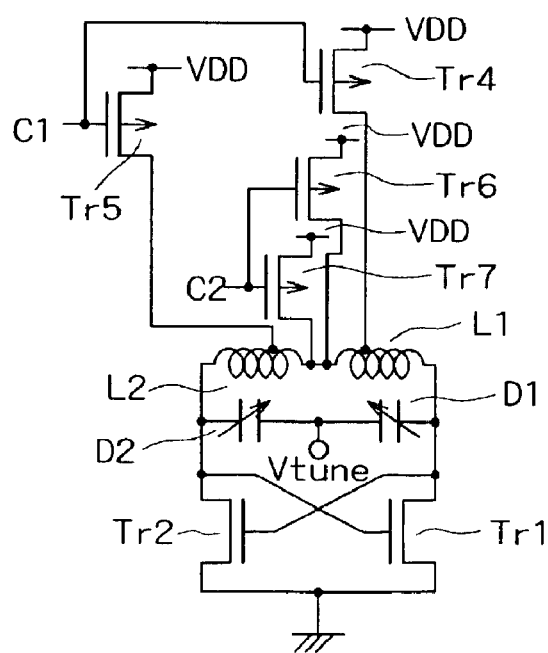
FIG. 8 is a circuit diagram showing a voltage controlled oscillator according to a second embodiment of the present invention.

Now, the present invention will be explained below with reference to a second embodiment. FIG. 8 is a circuit diagram showing a voltage controlled oscillator according to the second embodiment of the present invention.

In the second embodiment, the drains of P-channel transistors Tr6 and Tr7 are connected between the inductor L1 and the inductor L2, respectively. The sources of the transistors Tr6 and Tr7 are supplied with the power supply voltage VDD, while a control signal C2 is applied to the gates of the transistors Tr6 and Tr7. The drains of P-channel transistors Tr4 and Tr5 are connected to the midpoint positions of the inductors L1 and L2, respectively. The inductance between the drain of the transistor Tr4 and the drain of the transistor Tr6 is equal to that between the drain of the transistor Tr5 and the drain of the transistor Tr7. The sources of the transistors Tr4 and Tr5 are supplied with the power supply voltage VDD, while a control signal C1 is applied to the gates of the transistors Tr4 and Tr5.

Figure 9A:
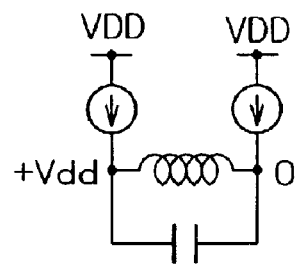
FIGS. 9A and 9B are equivalent circuit diagrams showing the operation of the second embodiment according to the present invention.
Figure 9B:
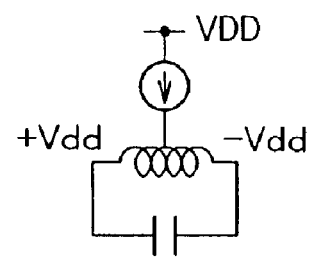
Figure 10A:
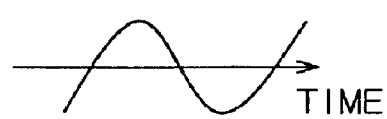
FIGS. 10A and 10B are waveform diagrams showing the operation of the second embodiment according to the present invention.
Figure 10B:
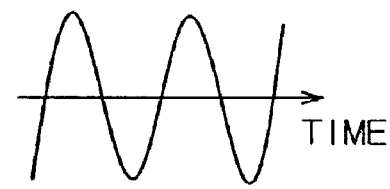

Now, the operation of the second embodiment configured as described above will be explained below. FIG. 9A illustrates an equivalent circuit with the control signal C1 in its active (low) state and the control signal C2 in its inactive (high) state. On the other hand, FIG. 9B illustrates an equivalent circuit with the control signal C1 in its inactive (high) state and the control signal C2 in its active (low) state. Additionally, FIG. 9A also shows such an extreme case where the connecting points between the drains of the transistors Tr4 and Tr5 and the inductors L1 and L2 are provided outside the inductors L1 and L2. FIG. 10A illustrates an oscillation signal having a waveform with the control signal C1 in its active state and the control signal C2 in its inactive state. On the other hand, FIG. 10B illustrates an oscillation signal having a waveform with the control signal C1 in its inactive state and the control signal C2 in its active state.

With the control signal C1 in its active state and the control signal C2 in its inactive state, the transistors Tr4 and Tr5 are in their ON states while the transistors Tr6 and Tr7 are in their OFF states. Accordingly, the state shown in FIG. 9A is very close to the case where the power supply voltage VDD is directly supplied to the variable-capacitance capacitor. On the other hand, with the control signal C1 in its inactive state and the control signal C2 in its active state, the transistors Tr6 and Tr7 are in their ON states while the transistors Tr4 and Tr5 are in their OFF states. Accordingly, as shown in FIG. 9B, the power supply voltage VDD is supplied to the connecting point between the inductors L1 and L2. As shown in FIGS. 10A and 10B, this leads to differences in frequency and maximum amplitude of the oscillation signal between the state shown in FIG. 9A with an amplitude from VDD to 0V across the inductor and the state shown in FIG. 9B with an amplitude from +VDD to −VDD across the inductor. Thus, the frequency and the maximum amplitude are greater when the control signal C1 is in its inactive state and the control signal C2 is in its active state. Even with the oscillation signals being the same in amplitude, the frequency of oscillation signal is greater when the control signal C1 is in its inactive state and the control signal C2 is in its active state, due to the difference in oscillation state across the inductor.

Accordingly, the second embodiment also makes it possible to change the oscillation frequency without changing the control voltage Vtune of the varactor diodes D1 and D2.

Figure 11:
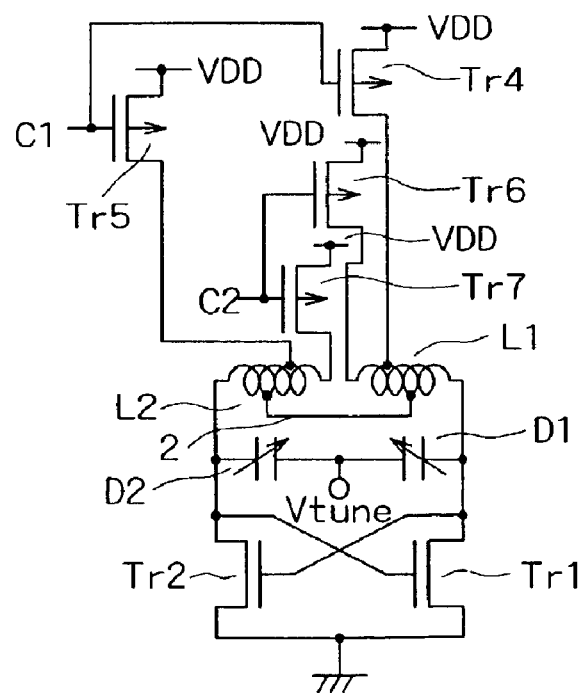
FIG. 11 is a circuit diagram showing a voltage controlled oscillator according to a third embodiment of the present invention.

Now, the present invention will be explained below with reference to a third embodiment. FIG. 11 is a circuit diagram showing a voltage controlled oscillator according to the third embodiment of the present invention.

In the third embodiment, the second embodiment is modified such that the inductors L1 and L2 are short-circuited with a short circuit line 2 at the points each closer to the varactor diodes D1 and D2 than the connecting points between the drains of the transistors Tr4, Tr5 and their corresponding inductors L1, L2.

Figure 12A:
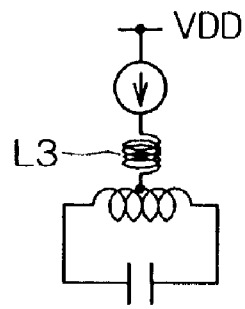
FIGS. 12A and 12B are equivalent circuit diagrams showing the operation of the third embodiment according to the present invention.
Figure 12B:
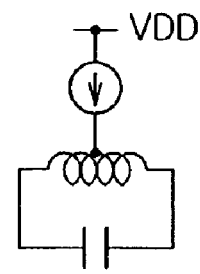
Figure 13A:
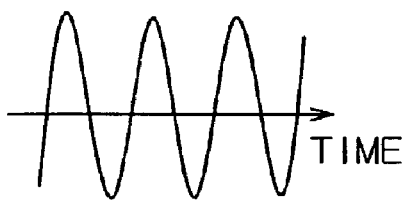
FIGS. 13A and 13B are waveform diagrams showing the operation of the third embodiment according to the present invention.
Figure 13B:
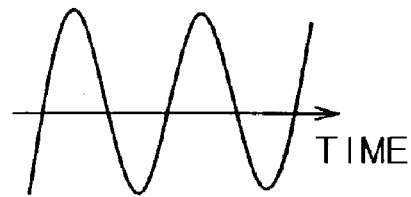

Now, the operation of the third embodiment configured as described above is explained below. FIG. 12A illustrates an equivalent circuit with the control signal C1 in its active state and the control signal C2 in its inactive state. On the other hand, FIG. 12B illustrates an equivalent circuit with the control signal C1 in its inactive state and the control signal C2 in its active state. FIG. 13A illustrates an oscillation signal having a waveform with the control signal C1 in its active state and the control signal C2 in its inactive state. On the other hand, FIG. 13B illustrates an oscillation signal having a waveform with the control signal C1 in its inactive state and the control signal C2 in its active state.

In the third embodiment, with the control signal C1 in its active state and the control signal C2 in its inactive state, the coil between the connecting points on the inductors L1 and L2 with the transistors Tr4 and Tr5 and with the short circuit line 2 acts as a choke coil L3, as shown in FIG. 12A. On the other hand, as shown in FIG. 12B, with the control signal C1 in its inactive state and the control signal C2 in its active state, this embodiment provides the same state as that of the second embodiment. As shown in FIGS. 13A and 13B, this causes the amplitude with the control signal C1 in its active state and the control signal C2 in its inactive state to be almost the same as that with the control signal C1 in its inactive state and the control signal C2 in its active state. This also causes the frequency with the control signal C1 in its active state and the control signal C2 in its inactive state to be higher than that with the control signal C1 in its inactive state and the control signal C2 in its active state.

Accordingly, the third embodiment also makes it possible to change the oscillation frequency without changing the control voltage Vtune of the varactor diodes D1 and D2. It is also possible to obtain a stable amplitude by changing the oscillation frequency.

Figure 14:
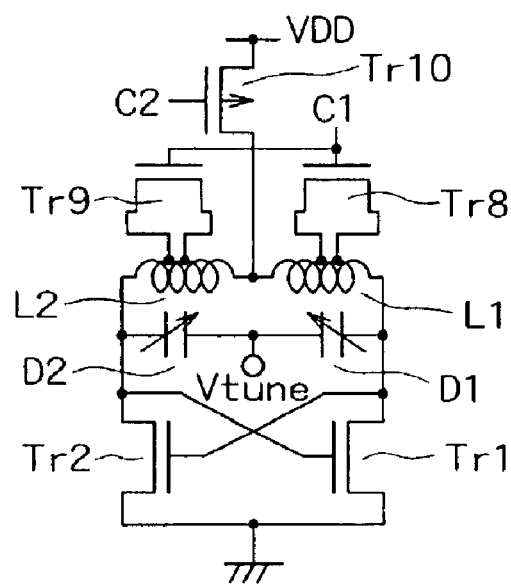
FIG. 14 is a circuit diagram showing a voltage controlled oscillator according to a fourth embodiment of the present invention.

Now, the present invention will be explained below with reference to a fourth embodiment. FIG. 14 is a circuit diagram showing a voltage controlled oscillator according to the fourth embodiment of the present invention.

The fourth embodiment is provided with a transistor Tr8 capable of short-circuiting between two points on the inductor L1 and a transistor Tr9 capable of short-circuiting between two points on the inductor L2. The control signal C1 is applied to the gates of the transistors Tr8 and Tr9. The drain of a P-channel transistor Tr10 is connected between the inductors L1 and L2. The source of the transistor Tr10 is supplied with the power supply voltage VDD and the control signal C2 is applied to the gate thereof.

Figure 15A:
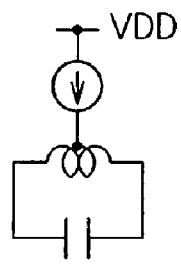
FIGS. 15A and 15B are equivalent circuit diagrams showing the operation of the fourth embodiment according to the present invention.
Figure 15B:
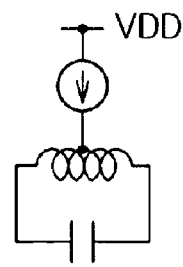
Figure 16A:
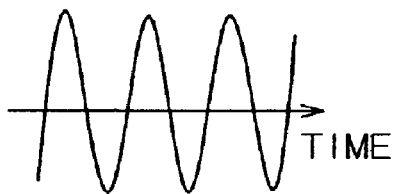
FIGS. 16A and 16B are waveform diagrams showing the operation of the fourth embodiment according to the present invention.
Figure 16B:
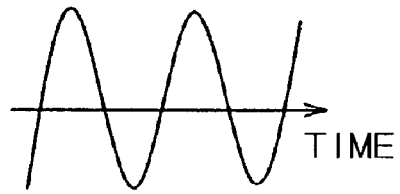

Now, the operation of the fourth embodiment configured as described above will be explained below. FIG. 15A illustrates an equivalent circuit with the control signals C1 and C2 in their active states. On the other hand, FIG. 15B illustrates an equivalent circuit with the control signal C1 in its inactive state and the control signal C2 in its active state. FIG. 16A illustrates an oscillation signal having a waveform with the control signal C1 in its active state and the control signal C2 in its inactive state. On the other hand, FIG. 16B illustrates an oscillation signal having a waveform with the control signal C1 in its inactive state and the control signal C2 in its active state.

With the control signals C1 and C2 in their active states, the transistors Tr8 and Tr9 are in their ON states. The transistor Tr10 is in its OFF state. On the other hand, with the control signal C1 in its inactive state and the control signal C2 in its active state, the transistor Tr10 is in its ON state, and the transistors Tr8 and Tr9 are in their OFF states. Since the inductance of the oscillation circuit is thus lower with the control signals C1 and C2 in their active states as shown in FIGS. 15A and 15B, the frequency of the oscillation signal is higher as shown in FIGS. 16A and 16B.

Accordingly, the fourth embodiment also makes it possible to change the oscillation frequency without changing the control voltage Vtune of the varactor diodes D1 and D2 as well as to obtain a stable amplitude even by changing the oscillation frequency.

Figure 17:
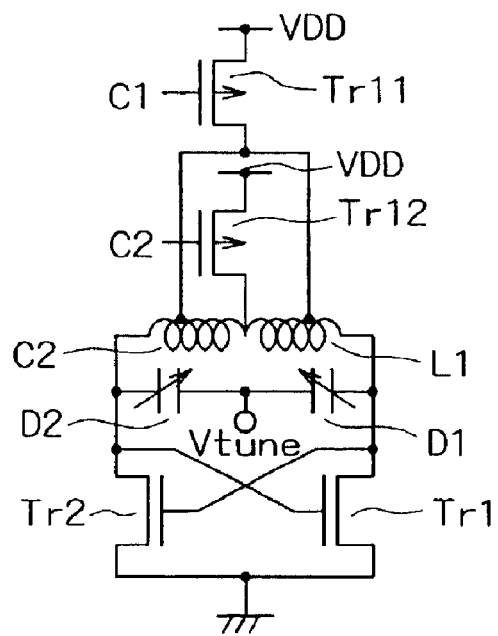
FIG. 17 is a circuit diagram showing the configuration of a circuit in which each pair of transistors is integrated into one transistor in the second embodiment.

In the second to fourth embodiments, one transistor, the drain of which is connected to an inductor, is provided for each inductor; however, these transistors may be integrated into one transistor. FIG. 17 is a circuit diagram showing the configuration of a circuit in which a pair of transistors are integrated into one transistor in the second embodiment. A P-channel transistor Tr11 corresponds to the transistors Tr4 and Tr5, while a P-channel transistor Tr12 corresponds to the transistors Tr6 and Tr7.

On the other hand, as in the first embodiment, multiple pairs of transistors, the drain of which is connected to the midpoint position of an inductor, may also be provided.

As described above, the present invention makes it possible to vary the inductance of the whole circuit, thereby providing an increased variable range of oscillation frequency. Accordingly, even when the inductor is fabricated to be slightly different in shape from the designed one, tuning can be performed to provide the desired oscillation frequency.

What is claimed is:

1. A voltage controlled oscillator comprising:
    a pair of variable-capacitance capacitors having capacitance controlled by a common control voltage,
    a pair of inductors each connected to each of said pair of variable-capacitance capacitors,
    a constant current power supply for supplying an electric current to said pair of inductors, and
    a switching device which switches between lengths of said pair of inductors through which the electric current flows said switching device effecting a common effective length in each inductor of said pair of inductors
    wherein said switching device comprises:
    a pair of switches each connected to one end portion of said pair of inductors opposite to the other end portion to which each of said variable-capacitance capacitors is connected, and
    at least one additional pair of switches each connected to a position between both end portions of each of said pair of inductors.

2. The voltage controlled oscillator according to claim 1, wherein
    said pair of switches and said at least one additional pair of switches comprises transistors.

3. The voltage controlled oscillator according to claim 1, wherein
    said pairs of inductors is connected to said pair of variable-capacitance capacitors, said pair of inductors being supplied with an electric current by said constant current power supply, said electric current flowing therethrough being switched by said switching device.

4. A voltage controlled oscillator comprising:
    a pair of variable-capacitance capacitors having capacitance controlled by a common control voltage,
    a pair of inductors each connected to each of said pair of variable-capacitance capacitors,
    a constant current power supply for supplying an electric current to said pair of inductors, and
    switching device which switches between positions on said pair of inductors at which the electric current is supplied thereto said switching device effecting common switching positions in each inductor of said pair of inductors wherein said switching device comprises:
    a pair of transistors each connected to one end portion of said pair of inductors opposite to the other end portion to which each of said variable-capacitance capacitors is connected, and
    at least one additional pair of transistors each connected to a position between both end portions of each of said pair of inductors.

5. The voltage controlled oscillator according to claim 4, further comprising:
    a short circuit line for short-circuiting between said pair of inductors at positions thereof each closer to each of said variable-capacitance capacitors than said positions at which said at least one additional pair of transistors are connected to said pair of inductors.

6. A voltage controlled oscillator comprising:
    a pair of variable-capacitance capacitors having capacitance controlled by a common control voltage,
    a pair of inductors each connected to each of said pair of variable-capacitance capacitors,
    a constant current power supply for supplying an electric current to said pair of inductors, and
    switching device which switches between positions on said pair of inductors at which the electric current is supplied thereto said switching device effecting common switching positions in each inductor of said pair of inductors wherein said switching device comprises:
    a transistor connected to one end portion of said pair of inductors opposite to the other end portion to which each of said variable-capacitance capacitor is connected, and
    at least one additional pair of transistors, provided at a position between both end portions of each of said pair of inductors, for short-circuiting part of the pair of inductors.

7. A voltage controlled oscillator comprising:
    a pair of variable-capacitance capacitors having capacitance controlled by a common control voltage,
    a pair of inductors each connected to each of said pair of variable-capacitance capacitors,
    a constant current power supply for supplying an electric current to said pair of inductors, and
    a switching device which switches between lengths of said pair of inductors through which the electric current flows said switching device effecting a common effective length in each inductor of said pair of inductors wherein said pair of inductors are connected to said constant current power supply via said switching device.

8. A voltage controlled oscillator comprising:
    a pair of variable-capacitance capacitors having capacitance controlled by a common control voltage,
    a pair of inductors each connected to each of said pair of variable-capacitance capacitors,
    a constant current power supply for supplying an electric current to said pair of inductors, and
    switching device which switches between positions on said pair of inductors at which the electric current is supplied thereto said switching device effecting common switching positions in each inductor of said pair of inductors wherein said pair of inductors are connected to said constant current power supply via said switching device.

9. The voltage controlled oscillator according to claim 1, wherein
    said pair of inductors are disposed symmetrically with respect to said switching device interposed therebetween.

10. The voltage controlled oscillator according to claim 4, wherein said pair of inductors are disposed symmetrically with respect to said switching device interposed therebetween.

11. A voltage controlled oscillator comprising:

a pair of variable-capacitance capacitors;

a first and second inductors, said first inductor having a first and second ends, said first end of said first inductor being connected, to one of said pair of variable-capacitance capacitors, and said second inductor having a first and second ends, said first end of said second inductor being connected to another of said pair of variable-capacitance capacitors;

a switching device provided to change lengths of said first and second inductors through which an electric current flows;

wherein said switching device comprises:

a first and second switches, said first switch being connected to an intermediate position between said first and second ends of said first inductor, and said second switch being connected to an intermediate position between said first and second ends of said second inductor.

12. The voltage controlled oscillator according to claim 11, said switching device further including:

a third switch being connected to said second end of said first inductor for supplying said electric current to said second end of said first inductor.

13. The voltage controlled oscillator according to claim 12, said switching device further including:

a fourth switch being connected to said second end of said second inductor for supplying said electric current to said second end of said second inductor.

14. The voltage controlled oscillator according to claim 13, further including:

a constant current power supply supplying said electric current to said first and said inductors.

15. The voltage controlled oscillator according to claim 14, wherein said variable-capacitance capacitors are controlled by a common control voltage.

16. The voltage controlled oscillator according to claim 15, wherein each of said first and second switches includes a transistor.

17. The voltage controlled oscillator according to claim 16, wherein said switching device effects a common effective length in each of said first and second inductors.

* * * * *